United States Patent
Carpenter et al.

(10) Patent No.: US 9,948,039 B2
(45) Date of Patent: Apr. 17, 2018

(54) APPARATUS FOR A SHIELDED F-CONNECTOR

(71) Applicant: THOMSON LICENSING, Issy-les-Moulineaux (FR)

(72) Inventors: Joseph Carpenter, Noblesville, IN (US); Mickey J. Hunt, Camby, IN (US)

(73) Assignee: THOMSON Licensing, Issy-les-Moulineaux (FR)

( * ) Notice: Subject to any disclaimer, the term of this patent is extended or adjusted under 35 U.S.C. 154(b) by 0 days.

(21) Appl. No.: 15/466,488

(22) Filed: Mar. 22, 2017

(65) Prior Publication Data
US 2017/0279227 A1    Sep. 28, 2017

Related U.S. Application Data

(60) Provisional application No. 62/312,765, filed on Mar. 24, 2016.

(51) Int. Cl.
| H01R 12/00 | (2006.01) |
|---|---|
| H01R 24/50 | (2011.01) |
| H01R 13/6581 | (2011.01) |
| H05K 9/00 | (2006.01) |
| H01R 103/00 | (2006.01) |

(52) U.S. Cl.
CPC ......... *H01R 24/50* (2013.01); *H01R 13/6581* (2013.01); *H01R 2103/00* (2013.01); *H05K 9/0022* (2013.01)

(58) Field of Classification Search
CPC .................................................. H05K 9/0022

USPC ................................................. 439/63, 581
See application file for complete search history.

(56) References Cited

U.S. PATENT DOCUMENTS

| 7,749,017 B2 * | 7/2010 | Yamamoto ........... H05K 9/0022 |
|---|---|---|
| | | 439/63 |
| 9,271,431 B2 | 2/2016 | Lee et al. |
| 2012/0287588 A1 | 11/2012 | Muterspaugh et al. |

FOREIGN PATENT DOCUMENTS

| JP | 03004661 U1 | 1/1991 |
|---|---|---|
| JP | 4109593 U | 9/1992 |
| JP | 2012147321 A | 8/2012 |
| JP | 5538346 B2 | 5/2014 |

* cited by examiner

*Primary Examiner* — Tho D Ta
(74) *Attorney, Agent, or Firm* — Jerome G. Schaefer

(57) ABSTRACT

An improved F-connector can be mounted perpendicularly on a printed circuit board to reduce radiated emissions by using an integrated shield flange on the F-connector body. The improved F-connector is attached to a shield frame that is part of an RF shield containment box mounted on the printed circuit board. In one embodiment, the shield flange is integral to the improved F-connector body and is manufactured to fill the gap between an RF shield frame and a corresponding RF shield cover. The improved F-connector with integral shielding flange mounted on the shield frame utilizes the shield flange of the improved F-connector to fill the physical gaps between the shield cover the improved F-connector. With reduced or eliminated physical gaps, the radiated emission of the assembly are either reduced or eliminated.

20 Claims, 9 Drawing Sheets

APPARATUS FOR A SHIELDED F-CONNECTOR

CROSS REFERENCE TO RELATED APPLICATIONS

This application claims the benefit of U.S. provisional patent application No. 62/312,765 filed 24 Mar. 2016, which is incorporated by reference herein in its entirety for all purposes.

FIELD

The present principles relate to a shielded connector, specifically, a shielded F-Type connector mounted on a printed circuit board.

BACKGROUND

The F-type connector, otherwise known as an F-connector is a coaxial RF connector commonly used for "over the air" terrestrial television, cable television, and universally for satellite television and cable modems. Generally, RG-6/U cable or RG-59/U cable is used to connect to F connectors. The F connector has good 75Ω impedance match for frequencies well over 1 GHz and has usable bandwidth up to several GHz.

F-Connectors are often used on printed circuit boards (PCBs). On a PCB where a metal shield cover is used to isolate RF noise from other circuitry, the installation of an F-connector can introduce physical gaps which allow radiated emissions to interfere with nearby circuitry. Such interference is undesirable and can adversely affect nearby circuit operation. In addition, a leaky installation of an F connector also produces a path for circuitry inside the metal shield cover to become susceptible to a source of RF outside of the shield. Thus, the shield itself becomes less effective. A technique to perpendicularly mount an F-connector into a shield cover without radiated emission or radiated susceptibility is desired.

SUMMARY

This summary is provided to introduce a selection of concepts in a simplified form as a prelude to the more detailed description that is presented later. The summary is not intended to identify key or essential features, nor is it intended to delineate the scope of the claimed subject matter.

In accordance with one aspect of the present principles, an improved F-connector can be mounted perpendicularly on a printed circuit board to reduce radiated emissions by using an integrated shield flange on the F-connector body. The improved F-connector is attached to a shield frame that is part of an RF shield containment box mounted on the printed circuit board. In one embodiment, the shield flange is integral to the improved F-connector body and is manufactured to fill the gap between an RF shield frame and a corresponding RF shield cover. The improved F-connector with integral shielding flange mounted on the shield frame utilizes the shield flange of the improved F-connector to fill the physical gaps between the metal shield cover and the metal shield frame upon which the improved F-connector is mounted. With reduced or eliminated physical gaps, the radiated emission of the assembly are either reduced or eliminated.

Additional features and advantages will be made apparent from the following detailed description of illustrative embodiments which proceeds with reference to the accompanying figures. It should be understood that the drawings are for purposes of illustrating the concepts of the disclosure and is not necessarily the only possible configuration for illustrating the disclosure.

BRIEF DESCRIPTION OF THE DRAWINGS

The foregoing summary, as well as the following detailed description of illustrative embodiments, is better understood when read in conjunction with the accompanying drawings, which are included by way of example, and not by way of limitation with regard to the present principles. In the drawings, like numbers represent similar elements.

DETAILED DISCUSSION OF THE EMBODIMENTS

In the following description of various illustrative embodiments, reference is made to the accompanying drawings, which form a part thereof, and in which is shown, by way of illustration, how various embodiments may be practiced. It is to be understood that other embodiments may be utilized and structural and functional modification may be made without departing from the scope of the present principles.

The problem of how to mount an F-connector perpendicular to a PCB can be complicated by performance degradation due to radiated emissions and susceptibility from RF-leaky mounting structures. Serviceability is also a concern where circuitry sharing a containment RF shield near a permanently mounted F-connector must be inspected or adjusted by removing the RF shield. During the inspection, there should be minimal blockage to inspect the nearby circuitry and the F-connector mechanical and electrical integrity. After the inspection, the RF shield should be easy to replace and have the same shielding performance as before the inspection. The current disclosure addresses these concerns by mounting an F-connector perpendicular to a PCB while providing shielding to reduce or eliminate RF gaps that could introduce the possibility of undesirable radiated emissions or RF susceptibility.

Figure 1:
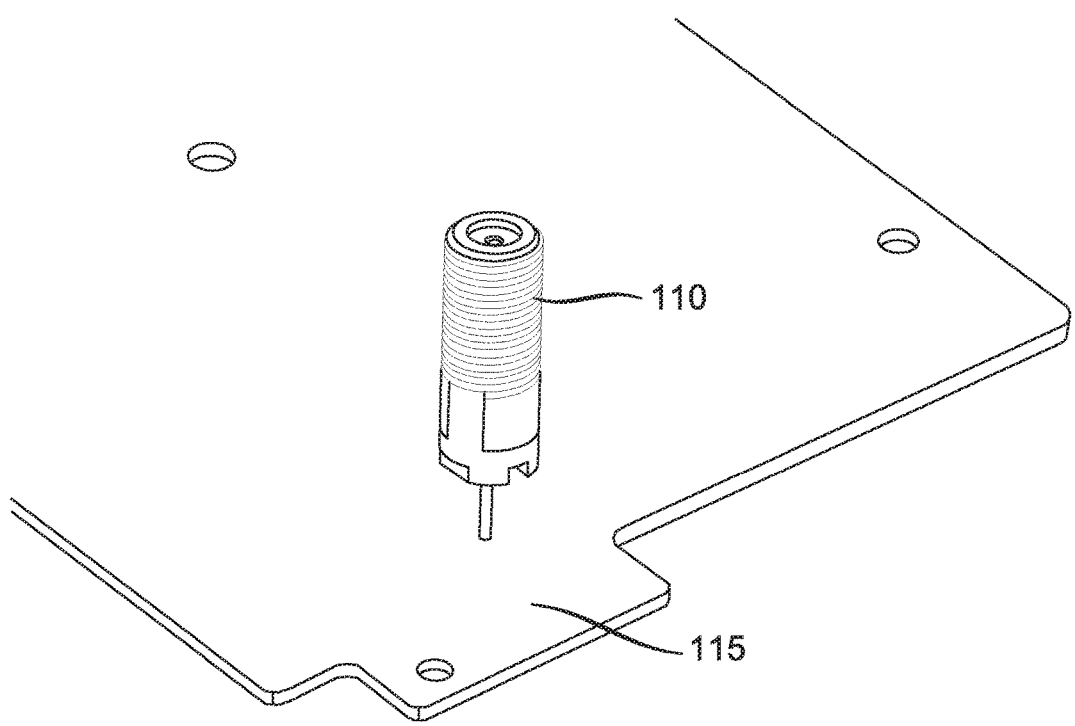
FIG. 1 illustrates a prior art F-connector mounted on an example PCB.
Figure 2A:
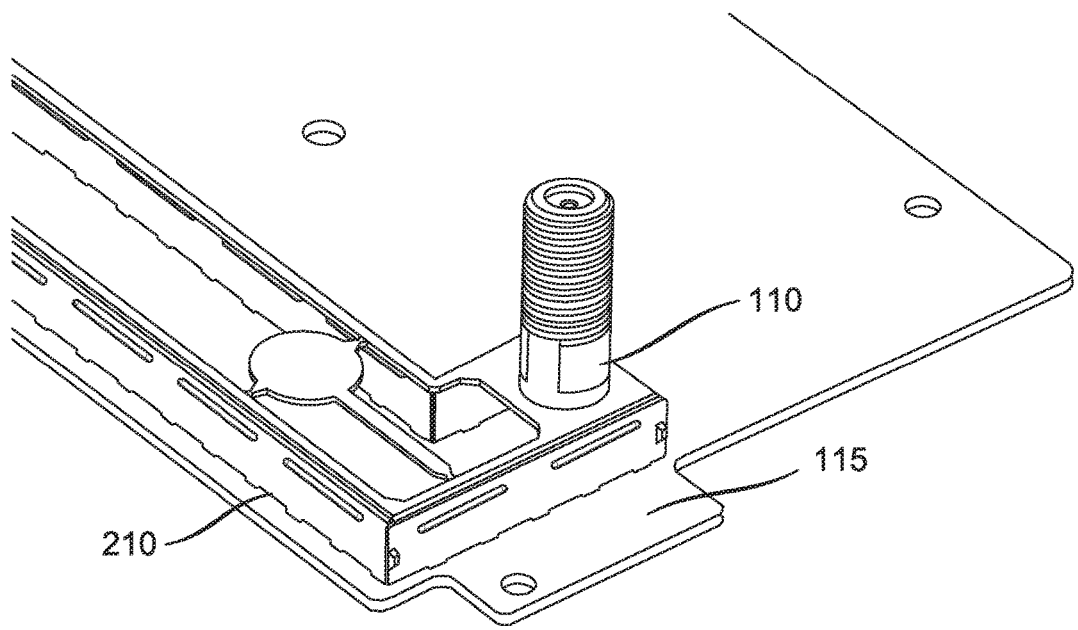
FIG. 2A depicts a prior art F-connector mounted onto am example shield frame.
Figure 2B:
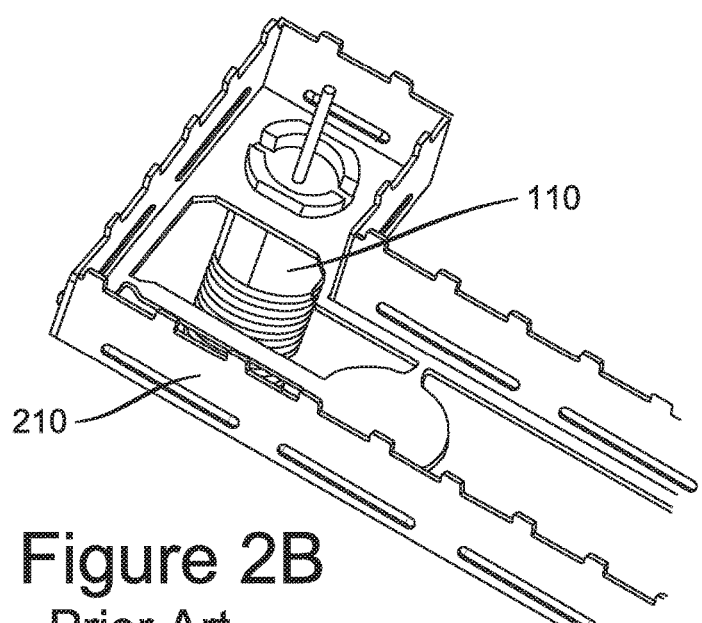
FIG. 2B depicts a prior art F-connector swaged and soldered to a shield frame.

FIG. 1 depicts a prior art perpendicular mount of an F-connector 110 on an example PCB 115. The mount does not provide for shielding of nearby components form RF emissions resulting from the signals passed through the connector. FIG. 2A depicts a prior art F-connector 110 mounted on a metal shield frame 210 that addresses the concern of shielding of nearby circuits. FIG. 2B shows underside details of the swaged and soldered F-connector 110 to the metal RF shield frame 210. The metal shield frame 210 is part of a shielding scheme which includes an RF shield box mounted onto the printed circuit card 115. The RF box includes both a RF shield frame 210 and an RF shield cover as shown in FIG. 3.

Figure 3:
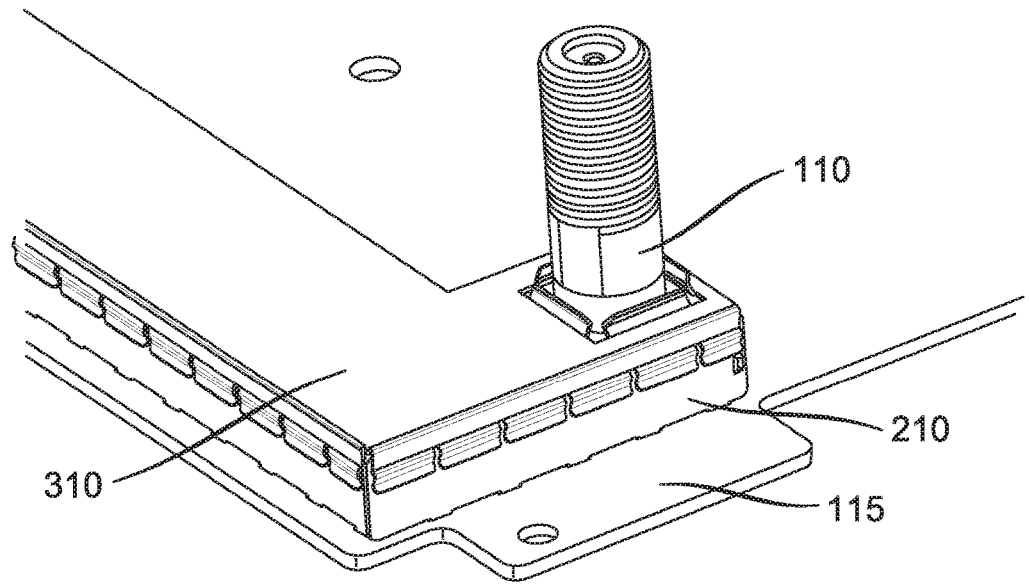
FIG. 3 depicts a prior art F-connector and an example shield cover.
Figure 4:
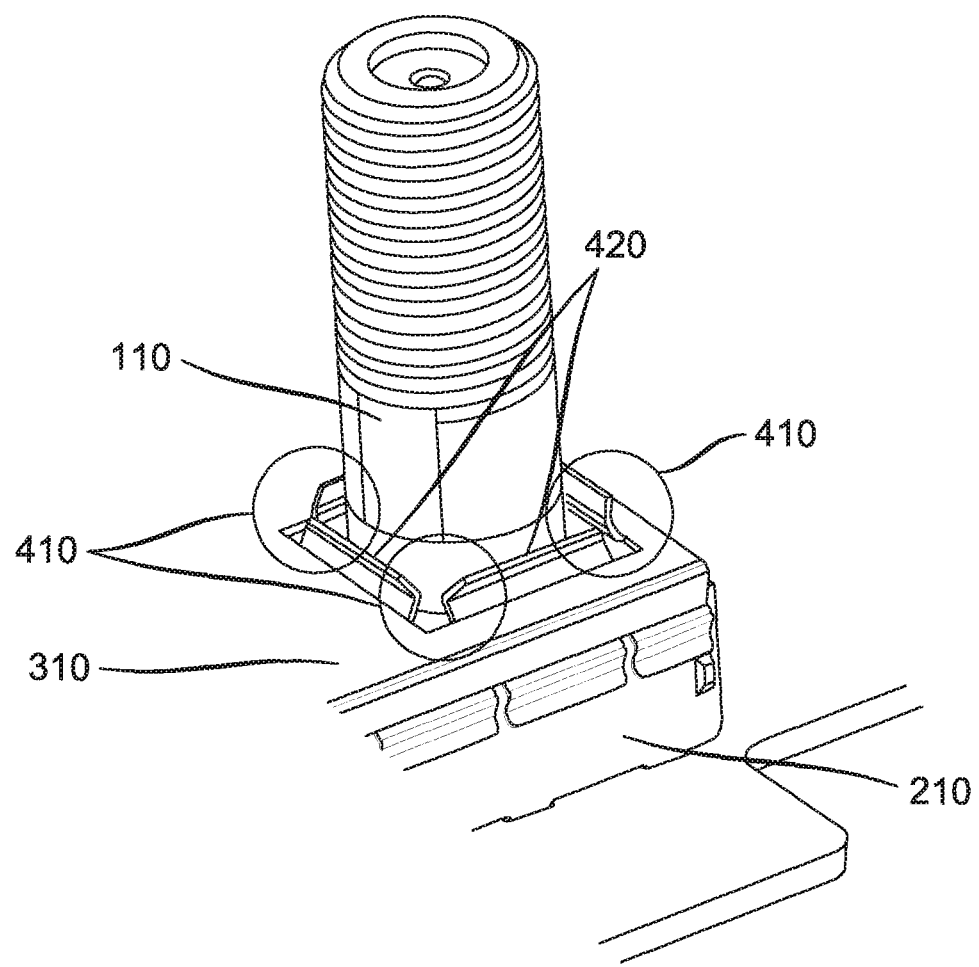
FIG. 4 depicts a prior art F-connector and example shield cover highlighting physical gaps.

FIG. 3 shows the same typical prior art assembly as in FIG. 2A with a shield cover 310 installed to keep the RF circuitry inside the envelope of the shield frame 210 from emitting beyond the metal wall of the shield frame 210. Note that the shield cover has a square hole to accommodate the F-connector when the shield cover 310 is installed onto the shield frame 210. The assembly of an RF shield frame 210 and a shield cover 310 may be termed RF shield box which is mounted on a PCB 115. However, in such a typical prior art construction as in FIG. 3, gaps result between the shield frame 210 and the shield cover 310 around the F-connector 110 when the shield cover 310 is installed. FIG. 4 highlights these gaps. The gaps 410 (circled in FIG. 4) can form as a result of construction at the corners of the shield cover 310 and openings for the F-connector 110. Also, gaps can result from the difference between the round F-connector body and the square hole cut for the F-connector in the shield cover. The points at 420 (two shown, four total) indicate that the shield cover 310 only has a point contact with the F-Connector 110 in four locations or quadrants.

Figure 5:
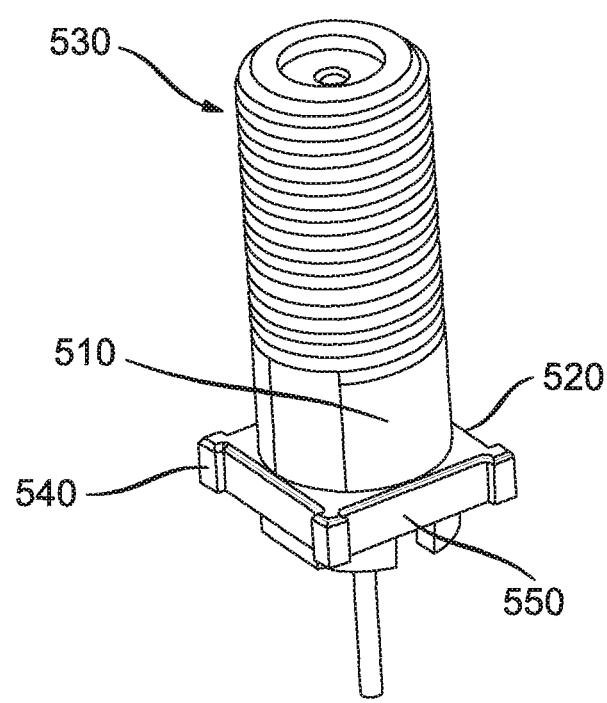
FIG. 5 depicts an improved F-connector with a shield flange.
Figure 6A:
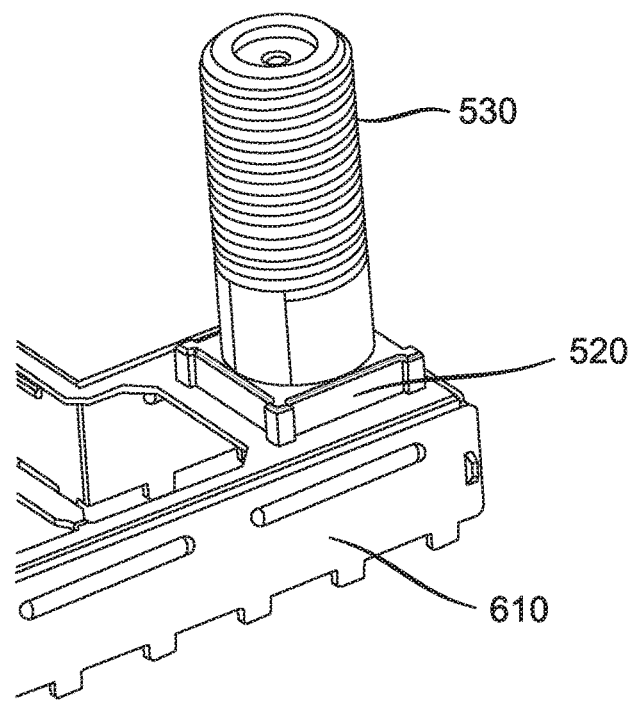
FIG. 6A depicts an improved F-connector mounted onto an example shield frame.
Figure 6B:
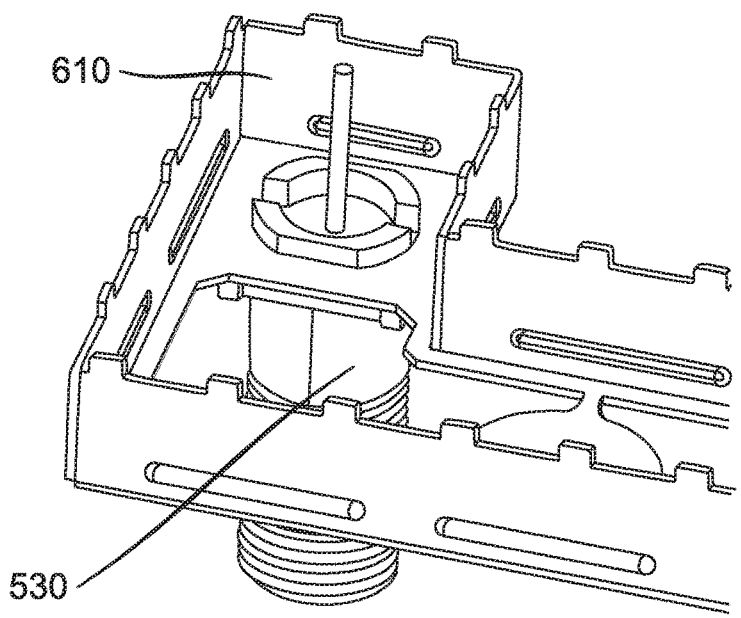
FIG. 6B depicts an improved F-connector with the shielding flange swaged and soldered to the shield frame.

The advantageous design of the current disclosure begins with an improved F-connector 530 as shown in FIG. 5. Shown in FIG. 5 is the addition of a shielding flange 520 on the F-Connector body 510. The shielding flange 520 includes corner lugs 540 and flat sides 550. The corner lugs 540 fill the gaps between the round F-connector body 510 and the corners of a hole in the shield cover that accommodates the F-connector. The flat sides 550 of the shielding flange help fill the gaps between the round F-Connector body 510 and the sides of the square hole in a shield cover that accommodates the F-connector. Such a flange 520 can be generated by machining the improved F-connector body 510 as a single article 530 having an integrated shielding flange 520. Alternately, a shielding flange can be manufactured for insertion and bonding (electrical and mechanical) onto an existing F-connector body 510 resulting in the improved F-connector 530 of FIG. 5. The improved F-connector 530 can then be used as a component in the metal shield frame 210 first shown in FIG. 2. FIG. 6A depicts the improved F-connector 530 mounted onto an example shield frame 610. FIG. 6B depicts the improved F-connector 530 having the integrated shielding flange 520 swaged and soldered on the metal shield frame.

Figure 7:
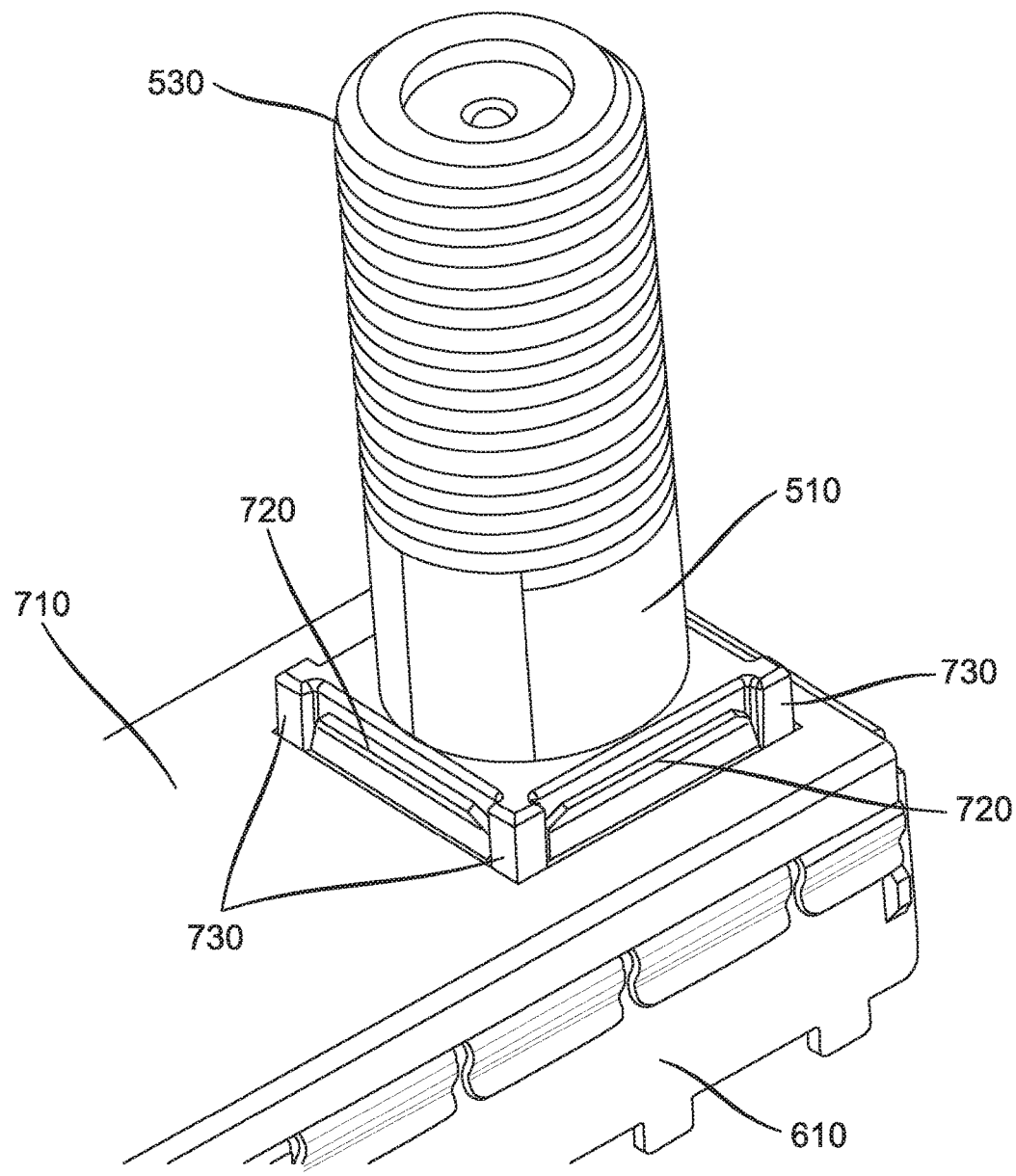
FIG. 7 depicts an improved F-connector with shielding flange and shield cover.

In one aspect of the disclosure, shown in FIG. 7, an assembly includes the improved F-connector 530 mounted onto the shield frame 610 can be covered with the shield cover 710 resulting in greatly reduced or eliminated gaps between the F-connector body 510 and the shield cover 710. Note that the shield cover 710 has a square hole to accommodate an F-connector as was the example of FIG. 3. FIG. 7 shows the improved F-connector design installed on a shield frame 610 with a shield cover 710 installed over the F-connector. The gaps of the assembly of FIG. 4 are reduced or eliminated using the improved F-connector. In one aspect of the disclosure, the corner gaps 730 and the side gaps 720 are eliminated. Note that the gaps 720 and 730 are eliminated between the square hole portion of the shield cover 710 and the round F-connector body 510. In another aspect, the corner lugs 540 of the shielding flange 520 on the improved F-connector 530 fill the gaps of the square corners of the hole in the shield cover 710 that accommodates the F-connector. Also, the flat sides 550 of the shielding flange 520 on the improved F-connector 530 eliminate the gaps along the sides of the square hole of the shield cover 710 that is constructed to accept the F-connector 530.

Figure 8:
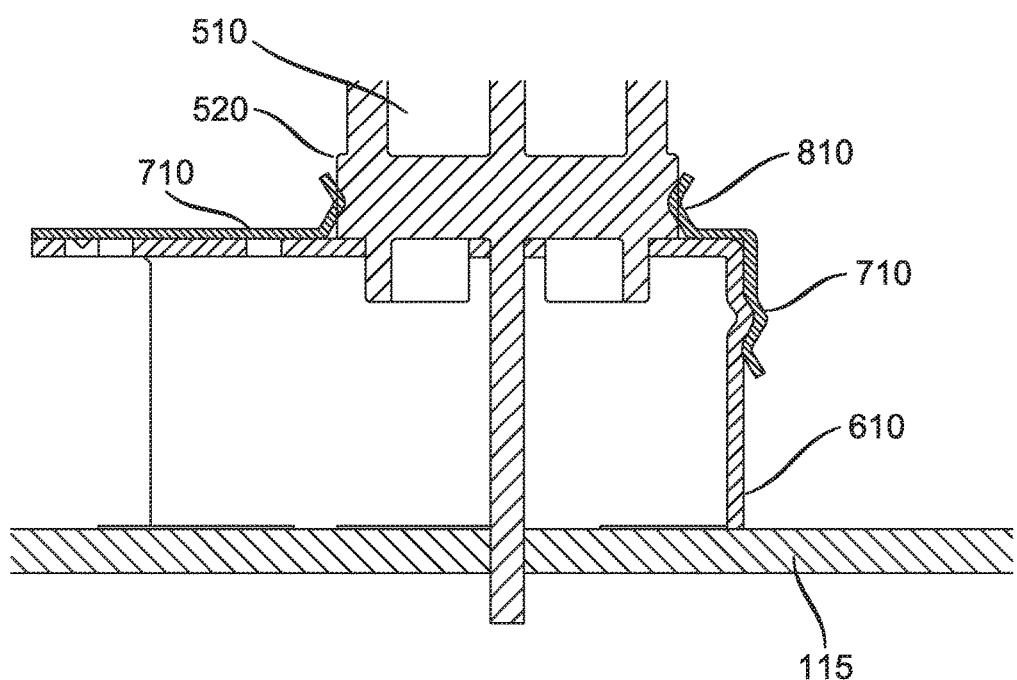
FIG. 8 depicts a sectional view of FIG. 7.

FIG. 8 is a section view of the improved F-connector design of FIG. 7. In FIG. 8, it can be viewed that the shielding flange 520 provides continuous contact area 810 with the square hole of the shield cover 710 in the RF box assembly. This improved contact areas reduces or eliminates the previously described prior art gaps 410 and 420 between the square hole of the shield cover 310 and the round F-connector body 110 shown in FIG. 4. As a result of the reduction or elimination of gaps with the improved F-connector 530, RF emission from circuitry within the shielded compartment of the RF shield box shield cover 710 and shield frame 610 is greatly reduced or eliminated.

Figure 9A:
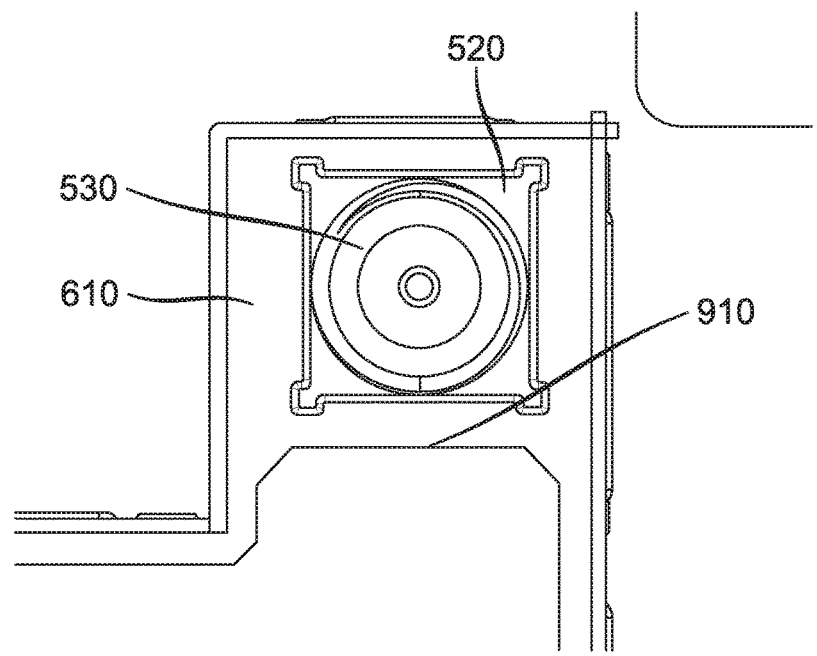
FIG. 9A depicts an improved F-connector with reduced shield flange area.
Figure 9B:
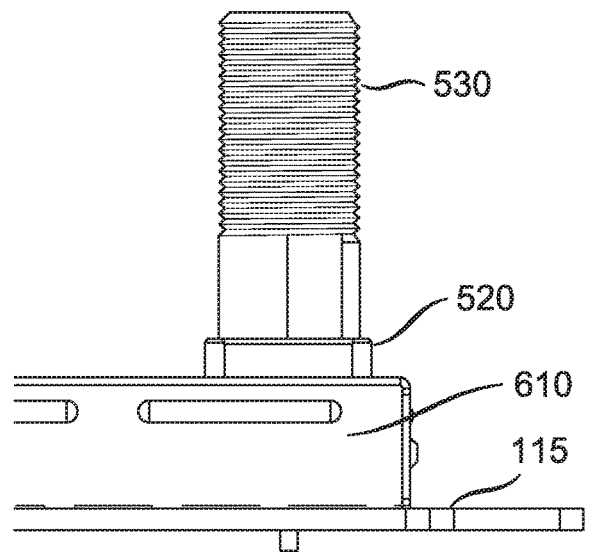
FIG. 9B depicts a low profile design use of the improved F-connector design.

FIG. 9A depicts another aspect of the disclosure. A construction of the shield frame 610 itself can advantageously be reduced in a flange area 910 around the F-connector 530 mounting location to use less material and provide better inspection or soldering of the F-connector installation. This opening up of the flange area can also allow an inspection of or even an adjustment of circuitry within the confines of the shield frame 610 during an inspection or repair of the RF shield box. FIG. 9B depicts an example low profile shield design can be used to improve soldering and visual inspection.

The advantages of the above-described improved F-connector include reduced RF emissions and RF susceptibility from or to the shielded area of the shield frame and shield cover due to the reduction or elimination of gaps near the improved F-connector. These advantages are present when the improved F-connector includes a shielding flange integrated with or bonded to the F-connector body as used in a perpendicular mounting on an RF shield box mounted on a PCB. In one embodiment, the shield flange has a square design to fill the gaps of a shield cover with a square hole to accept the insertion of an F-connector.

The invention claimed is:

1. An apparatus providing shielding for a connector when used in conjunction with an RF shield box on a printed circuit board, the apparatus comprising:
   the RF shield box comprising a shield frame for connection to the printed circuit board and a shield cover to enclose the RF shield box;
   a shielding flange attached to a connector body of a connector, the connector body mounted onto the shield frame;
   the shield cover mounted over the shield frame, the shield cover having an opening for the connector with the shielding flange, the connector and the shielding flange extending through the shield cover when the shield cover is installed on the shield frame; and
   wherein the shielding flange of the connector body fills a gap between the shield cover and the shield frame when the shield cover is mounted on the shield frame, and wherein a shape of the connector is different than a shape of the opening for the connector.

2. The apparatus of claim 1, wherein the connector comprises an F-connector.

3. The apparatus of claim 1, wherein the shape of the connector is round and the shape of the opening is square.

4. The apparatus of claim 1, wherein the shielding flange is integral to the connector body.

5. The apparatus of claim 1, wherein the shielding flange is bonded to the connector body.

6. The apparatus of claim 1, wherein the shielding flange reduces radiated emissions from the connector when the shield cover is installed on the shield frame.

7. The apparatus of claim 1, wherein the shielding flange is square in shape to match a square opening in the shield cover.

8. The apparatus of claim 1, wherein a reduced or eliminated gap between the shield cover and the shield frame when the shield cover is mounted on the shield frame reduces or eliminates radiated emissions when an RF signal is passed through the connector body.

9. The apparatus of claim 1, wherein the shield cover is removable to permit visual inspection of the connector body connection to the printed circuit board.

10. The apparatus of claim 9, wherein an effective shielding of the RF box is maintained after re-installation of the shield cover after the visual inspection of the connector body connection.

11. The apparatus of claim 1, wherein the connector body mounted onto the shield frame by one of swaged and soldered onto the shield frame.

12. The apparatus of claim 1, wherein the connector body is mounted perpendicular to the printed circuit board.

13. An apparatus comprising:
   an RF shield box comprising a shield frame for connection to a printed circuit board and a shield cover to enclose the RF shield box;
   a shielding flange attached to a connector body of a connector, the connector body mounted onto the shield frame;
   the shield cover mounted over the shield frame, the shield cover having an opening for the connector with shielding flange, the connector and shielding flange extending through the shield cover when the shield cover is installed on the shield frame; and
   wherein the shielding flange of the connector body fills a gap between the shield cover and the shield frame when the shield cover is mounted on the shield frame, and wherein a shape of the connector is different than a shape of the opening for the connector.

14. The apparatus of claim 13, wherein the connector comprises an F-connector.

15. The apparatus of claim 13, wherein the shape of the connector is round and the shape of the opening is square.

16. The apparatus of claim 13, wherein the shielding flange is integral to the connector body.

17. The apparatus of claim 13, wherein the shielding flange is bonded to the connector body.

18. The apparatus of claim 13, wherein the shielding flange reduces radiated emissions from the connector when the shield cover is installed on the shield frame.

19. An apparatus comprising:
   a shield frame for connection to a printed circuit board;
   a shield cover;
   a connector having a connector body mounted onto the shield frame and a shielding flange which is attached to the connector body; wherein
   the shield cover being mounted over the shield frame, the shield cover having an opening for the connector with shielding flange, the connector and the shielding flange extending through the shield cover when the shield cover is installed on the shield frame;
   the shielding flange of the connector body fills a gap between the shield cover and the shield frame when the shield cover is mounted on the shield frame, and wherein a shape of the connector is different than a shape of the opening for the connector; and
   the shielding flange being configured for reducing radiated emissions from the connector when the shield cover is installed on the shield frame.

20. The apparatus of claim 19, wherein the connector comprises an F-connector.

* * * * *